United States Patent
Xing et al.

(10) Patent No.: US 9,857,647 B2
(45) Date of Patent: Jan. 2, 2018

(54) DISPLAY PANEL AND DISPLAY DEVICE THEREOF

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Zhenzhou Xing, Guangdong (CN); Bin Xiong, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 200 days.

(21) Appl. No.: 14/787,054

(22) PCT Filed: Sep. 25, 2015

(86) PCT No.: PCT/CN2015/090674
§ 371 (c)(1),
(2) Date: Oct. 26, 2015

(87) PCT Pub. No.: WO2017/049570
PCT Pub. Date: Mar. 30, 2017

(65) Prior Publication Data
US 2017/0160606 A1    Jun. 8, 2017

(51) Int. Cl.
*G02F 1/1362* (2006.01)
*G02F 1/1335* (2006.01)
(Continued)

(52) U.S. Cl.
CPC ...... *G02F 1/136204* (2013.01); *G02F 1/1368* (2013.01); *G02F 1/13439* (2013.01); *G02F 1/133514* (2013.01); *G02F 1/133528* (2013.01); *G02F 1/134309* (2013.01); *H01L 27/322* (2013.01); *H01L 27/3244* (2013.01); *H01L 51/5206* (2013.01); *H01L 51/5234* (2013.01); *H01L 51/5281* (2013.01); *G02F 2201/503* (2013.01); *H01L 2251/308* (2013.01); *H01L 2251/5338* (2013.01); *H01L 2251/5392* (2013.01)

(58) Field of Classification Search
CPC ......... G02F 1/136204; G02F 1/133514; G02F 1/1368; G02F 1/13439; G02F 1/133528; G02F 1/134309; G02F 2201/503; H01L 27/3244; H01L 27/322; H01L 51/5206; H01L 51/5281; H01L 51/5234; H01L 2251/5392; H01L 2251/308; H01L 2251/5338
See application file for complete search history.

(56) References Cited

FOREIGN PATENT DOCUMENTS

CN    104536184 A  *  4/2015

* cited by examiner

*Primary Examiner* — David V Bruce
(74) *Attorney, Agent, or Firm* — Andrew C. Cheng

(57) ABSTRACT

The present invention provides a display panel and a display device; the display panel comprises a TFT substrate, a color filter substrate and a conductive polarizer; the conductive polarizer covers a light radiation surface of the color filter substrate, a side perpendicular to the light radiation surface, and a side of the TFT substrate. The display panel can avoid influence of outside electric fields, and has a certain tap or drop ability.

18 Claims, 1 Drawing Sheet

(51) Int. Cl.
*G02F 1/1343* (2006.01)
*G02F 1/1368* (2006.01)
*H01L 27/32* (2006.01)
*H01L 51/52* (2006.01)

DISPLAY PANEL AND DISPLAY DEVICE THEREOF

TECHNICAL FIELD

The present invention relates to a display technology field, in particular to a display panel and a display device thereof.

BACKGROUND

The present display panel classifies into display technologies such as Liquid Crystal Display (LCD), Organic Light-Emitting Diode (OLED), and so on; a liquid crystal cell is arranged on LCD, and a voltage is applied to both side of the liquid crystal cell to control liquid crystal elements shift; organic materials is irritated by current in OLED to emit light, and two electrodes is also needed to imposed in the electric field.

Avoiding interferences of electric field around surroundings is needed as best as possible in order to increase accuracy and color effect of display panels, and that is like static electricity produced from rubbing in a biological electric field of human body. A current solution is inserting silver paste pad between a color filter substrate and a thin film transistor (TFT) substrate to form a loop, so that interferences caused from electric fields around surroundings can be shielded. Technical arts become more complex by this manner, and cost of the manufacture increases.

DISCLOSURE OF INVENTION

The present invention is mainly to solve the problem that a large cost is required in solving a problem of interferences caused from electric fields around surroundings occurred in a display panel in the prior art.

In order to solve the aforementioned technical problem, the present invention provides a display panel; the display panel is an OLED display panel comprising a TFT substrate, a color filter substrate and a conductive polarizer; the conductive polarizer covers a light radiation surface of the color filter substrate, a side perpendicular to the light radiation surface, and a side of the TFT substrate; the conductive polarizer comprises a conductive layer, and the conductive layer is disposed on an inner side of the conductive polarizer or a surface of the conductive polarizer.

Wherein, the conductive layer is a transparent conductive film.

In order to solve the aforementioned technical problem, the present invention further provides another display panel comprising a thin TFT substrate, a color filter substrate and a conductive polarizer; the conductive polarizer covers a light radiation surface of the color filter substrate, a side perpendicular to the light radiation surface, and a side of the TFT substrate.

Wherein, the conductive polarizer comprises a conductive layer, and the conductive layer is disposed on an inner side of the conductive polarizer or a surface of the conductive polarizer.

Wherein, the conductive layer is a transparent conductive film.

Wherein, the display panel is an OLED display panel.

Wherein, the display panel is a flexible display panel.

Wherein, the display panel is a liquid crystal display panel.

Wherein, the display panel further comprises a backlight module, and the backlight module is arranged on the other side of the TFT substrate that is faced against to the side toward the color filter substrate.

Wherein, a first electrode is arranged on the TFT substrate, a second electrode is arranged on the color filter substrate.

Wherein, both the first electrode and the second electrode are made of indium tin oxide (ITO).

In order to solve the aforementioned technical problem, the present invention further provides a display device, and the display device comprises a display panel; the display panel comprises a TFT substrate, a color filter substrate and a conductive polarizer; the conductive polarizer covers a light radiation surface of the color filter substrate, a side perpendicular to the light radiation surface, and a side of the TFT substrate.

Wherein, the conductive polarizer comprises a conductive layer, and the conductive layer is disposed on an inner side of the conductive polarizer or a surface of the conductive polarizer.

Wherein, the conductive layer is a transparent conductive film.

Wherein, the display panel is an OLED display panel.

Wherein, the display panel is a flexible display panel.

Wherein, the display panel is a liquid crystal display panel.

Wherein, the display panel further comprises a backlight module, and the backlight module is arranged on the other side of the TFT substrate that is faced against to the side toward the color filter substrate.

Wherein, a first electrode is arranged on the TFT substrate, a second electrode is arranged on the color filter substrate.

Wherein, both the first electrode and the second electrode are made of indium tin oxide (ITO).

The advantageous effects of the present invention different from prior art are as following; a display panel of the present invention comprises a TFT substrate, a color filter substrate and a conductive polarizer; the conductive polarizer covers a light radiation surface of the color filter substrate, a side perpendicular to the light radiation surface, and a side of the TFT substrate; the flexibility of the conductive polarizer can cover the color filter substrate and the TFT substrate, and based on its electric conductive, the conductive polarizer can form a space for electrostatic shielding in order to the display panel can avoid influence of outside electric fields; besides, the conductive polarizer covering a light radiation surface of the color filter substrate, a side perpendicular to the light radiation surface, and a side of the TFT substrate has a certain protection for the both sides, so the display panel has a certain tap or drop ability.

DETAILED DESCRIPTION OF THE PREFERRED EMBODIMENTS

Figure 1:
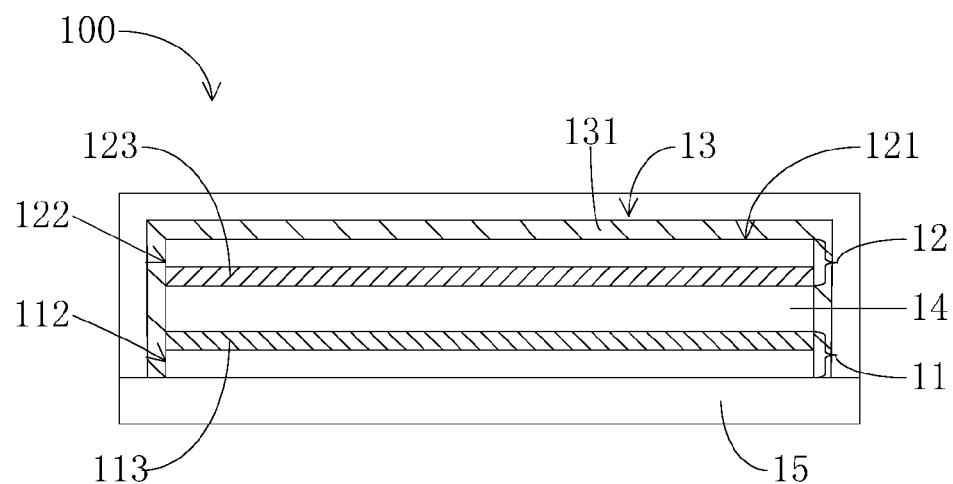
FIG. 1 is a structural schematic diagram of a display panel according to a first embodiment of the present invention.

Referring to FIG. 1, FIG. 1 is a structural schematic diagram of a display panel according to a first embodiment of the present invention. The display panel 100 of the embodiment comprises a TFT substrate 11, a color filter substrate 12 and a conductive polarizer 13.

Wherein, the TFT substrate 11 is a TFT array etched on a glass substrate for driving display image signal on pixels of the display panel 100; also, the color filter substrate 12 is a color filter arranged on the glass substrate, and the color filter is composed of the three primary colors of red, green, and blue of organic material in order that the light emitted by each pixel of a light radiation surface 121 of the color filter substrate 12 is composed of the three primary colors of red, green, and blue, and accomplishes that each pixel displays different color.

The conductive polarizer 13 covers the light radiation surface 121 of the color filter substrate 12, a side 122 perpendicular to the light radiation surface 121 the light radiation surface 121, and a side 112 of the TFT substrate 11. It is obvious that the color filter substrate 12 is disposed between the conductive polarizer 13 and the TFT substrate 11.

Structurally, reticular formations composing of conducting wires arranged on the TFT substrate 11 are TFT array. The conductive polarizer 13 and the TFT substrate 11 can form a space for electrostatic shielding in order to avoiding parts inside the space from interferences of electric field around surroundings, and the conductive polarizer 13 and the TFT substrate 11 forming the space for electrostatic shielding cannot interfere by electric field around surroundings when they work, so the display panel 100 can shield interferences from electric field around surroundings.

The conductive polarizer 13 is made of plastic film material, and is flexible; besides, the conductive polarizer 13 can be easily clad on the side 122 of the color filter substrate 12 and the side 112 of the TFT substrate 11 in the manufacturing process, and protection works on the TFT substrate 11 and the color filter substrate 12, so the display panel 100 has a certain tap or drop ability. The conductive polarizer 13 is a stacked structure comprising a conductive layer 131, and the conductive layer 131 can be arranged on an inside layer or a surface layer of the conductive polarizer 13. The inside layer means a middle layer of multiple stacked layers, and the surface layer comprises two surface layers disposed outside. The conductive layer 131 of the embodiment is a transparent conductive film, and is coated on the surface of the conductive polarizer 13.

In the present embodiment, the display panel 100 is a liquid crystal display panel, wherein, further comprises a liquid crystal layer 14 between the TFT substrate 11 and the color filter substrate 12. However, a first electrode 113 is arranged on the TFT substrate 11, a second electrode 123 is arranged on the color filter substrate 12, and the two electrodes are opposite polarity, so an electric field is formed between the two electrodes, and the liquid crystal layer 14 is controlled by variations in electric filed to control each light emitted of pixels. Wherein, both the first electrode and the second electrode are made of indium tin oxide (ITO).

The working principle of the display panel 100 is: adjusting variations of the liquid crystal layer 14 to control the light emitted, wherein the liquid crystal layer 14 is influenced by outside electric fields. Furthermore, in the present embodiment, the space for electrostatic shielding is formed by the conductive polarizer 13 and the TFT substrate 11, and protects the liquid crystal layer 14 against influence of outside electric fields.

The display panel 100 is a liquid crystal display panel, so backlight module 15 is needed for being a light source; the backlight module 15 is arranged on the other side of the TFT substrate 11 that is faced against to the side toward the color filter substrate 12, but is not in the space for electrostatic shielding forming by the conductive polarizer 13 and the TFT substrate 11; besides, the backlight module 15 is not influenced by outside electric fields while working.

Figure 2:
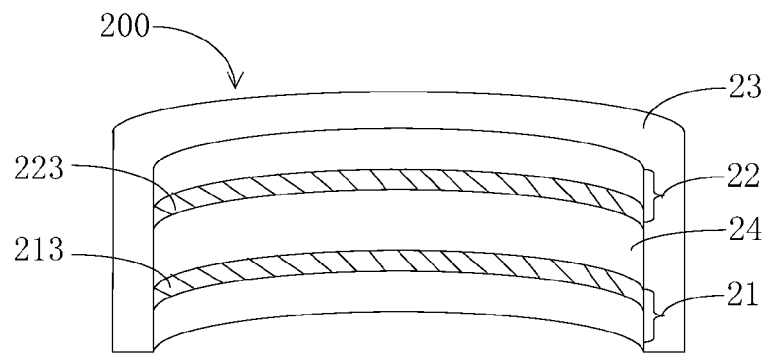
FIG. 2 is a structural schematic diagram of a display panel according to a second embodiment of the present invention.

Referring to FIG. 2, FIG. 2 is a structural schematic diagram of a display panel according to a second embodiment of the present invention. The display panel 200 of the embodiment comprises a TFT substrate 21, a color filter substrate 22 and a conductive polarizer 23.

The TFT substrate 21, the color filter substrate 22 and the conductive polarizer 23 of the display panel 200 of the embodiment are similar to those of the display panel 100, and repeats no more of thereof. The difference is that the display panel 200 is an OLED display panel, wherein, the OLED display panel further comprises an OLED emissive layer 24.

OLED emissive layer 24 is provided with auto-luminance property, and is irritated by current to emit light; the embodiment is that the OLED emitting layer 24 is arranged between the TFT substrate 21 and the color filter substrate 22. A electric field is formed between the first electrode 213 arranged on the TFT substrate 21 and the second electrode 223 arranged on the color filter substrate 12 in order that a current produced inside of a OLED emissive layer 24 irritates the OLED emissive layer 24 to emit light. Wherein, the first electrode 213 is anode made of ITO; the second electrode 223 is cathode made of metal silver; moreover, both electrodes are transparent electrodes.

The luminescent materials of the OLED emissive layer 24 emit different lights as the three primary colors of red, green, and blue according to different formulas; hence, in the other embodiment, the color filter substrate 22 is that the second electrode 223 is coated on a glass substrate without color filter.

The display panel 200 is an OLED display panel, and is provided with auto-luminance property so that a backlight module is unnecessary needed; the TFT substrate 21, the color filter substrate 22, and the OLED emissive layer 24 of the display panel 200 can be flexible film structures, so the display panel 200 can be made into a flexible display panel; therefore, the display panel 200 can be made as flexible display panel; the conductive polarizer 23 is a plastic film material, and covers the light radiation surface of the color filter substrate 22, a side of the color filter substrate 22, and a side of the TFT substrate 21 based on the shape of the color filter substrate 22 and the TFT substrate 21.

In the present embodiment, a space for electrostatic shielding is formed by the conductive polarizer 23 and the TFT substrate 21 to protect the OLED emissive layer 24 against influence of outside electric fields.

Different from prior art, a display panel of the present invention comprises a TFT substrate, a color filter substrate and a conductive polarizer; the conductive polarizer covers a light radiation surface of the color filter substrate, a side perpendicular to the light radiation surface, and a side of the TFT substrate; the flexibility of the conductive polarizer can cover the color filter substrate and the TFT substrate, and based on its electric conductive, the conductive polarizer can form a space for electrostatic shielding in order to the display panel can avoid influence of outside electric fields; besides, the conductive polarizer covering the light radiation surface of the color filter substrate, the side perpendicular to the light radiation surface, and the side of the TFT substrate has a certain protection for the both sides, so the display panel has a certain tap or drop ability.

Figure 3:
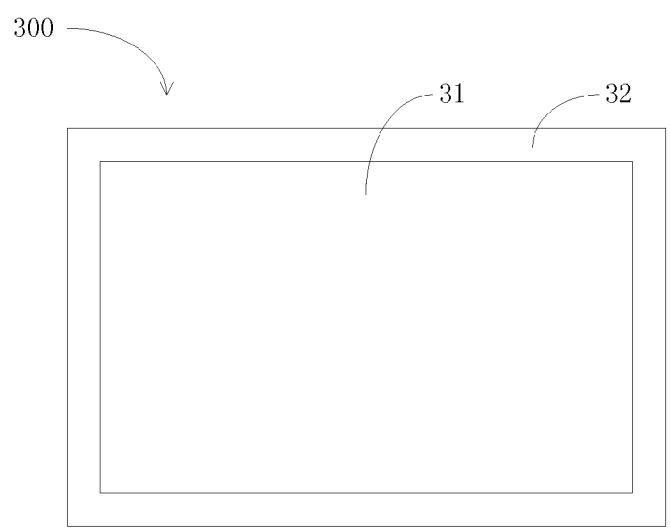
FIG. 3 is a structural schematic diagram of a display device according to a first embodiment of the present invention.

Referring to FIG. 3, FIG. 3 is a structural schematic diagram of a display device according to a first embodiment of the present invention. The display device 300 of the embodiment comprises a display panel 31 and a stand 32.

The display panel 31 can chose a display panel of both aforementioned embodiments, and the specific will not be repeatedly described herein; the stand 32 is used to sustain, fix, and protect the display panel 31.

Different from prior art, the display panel of the display device of the present invention comprises a TFT substrate, a color filter substrate and a conductive polarizer; the conductive polarizer covers a light radiation surface of the color filter substrate, a side perpendicular to the light radiation surface, and a side of the TFT substrate; thus, the display panel can avoid influence of outside electric fields, and then enforce display effect and display precision.

The aforementioned is only one embodiment of the invention, but not for limiting the claims of the invention; any equivalent device or equivalent effect flowchart, or directly or indirectly application in other related technical fields are all included in the claims of the invention.

The invention claimed is:

1. A display panel, wherein, the display panel is an OLED display panel and the display panel comprises a thin film transistor (TFT) substrate, a color filter substrate and a conductive polarizer; the conductive polarizer and the TFT substrate together form a space for electrostatic shielding, and the color filter substrate is located in the space; the conductive polarizer is a flexible stacked structure comprising a polarizer base and a conductive layer disposed on the polarizer base, the conductive polarizer covers a light radiation surface of the color filter substrate, a side surface of the color filter substrate perpendicular to the light radiation surface and a side surface of the TFT substrate and thereby the side surface of the color filter substrate and the side surface of the TFT substrate are covered by the conductive layer as well as the polarizer base.

2. The display panel according to claim 1, wherein, the conductive layer is a transparent conductive film.

3. A display panel, wherein, the display panel comprises a thin film transistor (TFT) substrate, a color filter substrate and a conductive polarizer; the conductive polarizer is a stacked structure comprising a polarizer base and a conductive layer disposed on the polarizer base, the conductive polarizer covers a light radiation surface of the color filter substrate, a side surface of the color filter substrate perpendicular to the light radiation surface and a side surface of the TFT substrate and thereby the side surface of the color filter substrate and the side surface of the TFT substrate are covered by the conductive layer as well as the polarizer base.

4. The display panel according to claim 3, wherein, the conductive layer is a transparent conductive film.

5. The display panel according to claim 3, wherein, the display panel is an OLED display panel.

6. The display panel according to claim 5, wherein, the display panel is a flexible display panel.

7. The display panel according to claim 3, wherein, the display panel is a liquid crystal display panel.

8. The display panel according to claim 7, wherein, the display panel further comprises a backlight module, and the backlight module is arranged on the other side of the TFT substrate that is faced against to the side toward the color filter substrate.

9. The display panel according to claim 3, wherein, a first electrode is arranged on the TFT substrate, a second electrode is arranged on the color filter substrate, and the first electrode and the second electrode are opposite polarity.

10. The display panel according to claim 9, wherein, both the first electrode and the second electrode are made of indium tin oxide (ITO).

11. A display device, wherein, the display device comprises a display panel; the display panel comprises a thin film transistor (TFT) substrate, a color filter substrate and a conductive polarizer; the conductive polarizer and the TFT substrate together form a space for electrostatic shielding, and the color filter substrate is located in the space; the conductive polarizer is a stacked structure comprising a polarizer base and a conductive layer disposed on the polarizer base, both of the conductive layer and the polarizer base cover a light radiation surface of the color filter substrate, a side surface of the color filter substrate perpendicular to the light radiation surface and a side surface of the TFT substrate.

12. The display device according to claim 11, wherein, the conductive layer is a transparent conductive film.

13. The display device according to claim 11, wherein, the display panel is an OLED display panel.

14. The display device according to claim 13, wherein, the display panel is a flexible display panel.

15. The display device according to claim 11, wherein, the display panel is a liquid crystal display panel.

16. The display device according to claim 15, wherein, the display panel further comprises a backlight module, and the backlight module is arranged on the other side of the TFT substrate that is face against the side toward the color filter substrate.

17. The display device according to claim 11, wherein, a first electrode is arranged on the TFT substrate, a second electrode is arranged on the color filter substrate, and the first electrode and the second electrode are opposite polarity.

18. The display device according to claim 17, wherein, both the first electrode and the second electrode are made of indium tin oxide (ITO).

* * * * *